United States Patent [19]
Schminke

[11] Patent Number: 4,532,483
[45] Date of Patent: Jul. 30, 1985

[54] COAXIAL RF MATCHING TRANSFORMER HAVING LINE SECTIONS SIMULTANEOUS ADJUSTABLE WHILE RETAINING A FIX TRANSFORMER LINE LENGTH

[75] Inventor: Wolfram Schminke, Laufenburg, Fed. Rep. of Germany

[73] Assignee: BBC Brown, Boveri & Company, Limited, Baden, Switzerland

[21] Appl. No.: 495,832

[22] Filed: May 18, 1983

[30] Foreign Application Priority Data

Jun. 4, 1982 [CH] Switzerland ........................ 3466/82

[51] Int. Cl.³ ........................ H03H 7/38
[52] U.S. Cl. ........................ 333/34; 333/263
[58] Field of Search ........................ 333/35, 33, 34, 160, 333/263, 245, 225, 226, 224

[56] References Cited

U.S. PATENT DOCUMENTS

| | | | |
|---|---|---|---|
| 1,927,393 | 9/1933 | Darbord | 333/35 |
| 2,408,745 | 10/1946 | Espley | 333/35 |
| 2,463,415 | 1/1949 | Nims, Jr. | 333/263 |
| 2,900,610 | 8/1959 | Allen et al. | 333/35 |

FOREIGN PATENT DOCUMENTS

| | | |
|---|---|---|
| 853353 | 10/1970 | Canada . |
| 233273 | 10/1944 | Switzerland . |

OTHER PUBLICATIONS

Moreno, T., *Microwave Transmission Design Data*, N.Y., Dover Publication, 1948, p. 97.

*Primary Examiner*—Eugene R. LaRoche
*Assistant Examiner*—Benny T. Lee
*Attorney, Agent, or Firm*—Oblon, Fisher, Spivak, McClelland & Maier

[57] ABSTRACT

A radio-frequency matching transformer including a wave guide (W) having a fixed length. The waveguide is subdivided into sections ($W_1$, $W_2$) which have different characteristic impedances and the lengths of which are interdependently adjustable. A hollow cylinder is provided within the waveguide displaceable therein such that the operating frequency and the transformation ratio can be adjusted within wide ranges without a conversion of the transformer being required. This results in considerable advantages with respect to the known quarter-wave transformer.

4 Claims, 6 Drawing Figures

COAXIAL RF MATCHING TRANSFORMER HAVING LINE SECTIONS SIMULTANEOUS ADJUSTABLE WHILE RETAINING A FIX TRANSFORMER LINE LENGTH

BACKGROUND OF THE INVENTION

1. Field of the Invention:

This invention relates to a radio-frequency matching transformer in the form of a coaxial line having at least two sections, each having a respective length and characteristic impedance.

2. Description of the Prior Art:

Such a matching transformer as above-noted is known in the field as a two-stage quarter-wave transformer. It consists of a wave guide the total length of which is equal to a half wavelength of the operating frequency $\lambda_o$. It is subdivided into two quarter wave line sections, the different characteristic impedances of which are determined by the terminal impedances at the input and output between which the matching is to be produced. Since the length of this transformer is directly linked to the operating frequency, its use is limited by its respective dimensions to an operating frequency lying within a narrow band of frequencies. In addition, the geometry also determines the characteristic impedances just as, for example, with a coaxial line, so that transformers of different designs are required for different matching applications.

If, therefore, in a variable-frequency radio-frequency circuit the operating frequency and/or the impedance ratios change to a relatively great extent, a transformer inserted into the circuit will have to be replaced by another one with different geometry. This leads to a time-consuming conversion, especially in power circuits such as, for example, radio-frequency generators, which is associated with problems with regard to the electric contact between the sections of wave guide and the length compensation as a result of the change in operating frequency and in addition only permits discontinuous tuning.

SUMMARY OF THE INVENTION

Accordingly, a basic object of this invention is to provide a novel, radio-frequency matching transformer, the working frequency and transfer ratio of which can be continuously adjusted without changing the installed mass of the transformer.

This and other objects is achieved by providing a novel radio-frequency matching transformer including a coaxial line having a longitudinal axis and a fixed length, wherein an outer conductor and an inner conductor are subdivided into at least first and second line sections ($W_1$, $W_2$), with the first line section ($W_1$) having a first length ($L_1$) and a first characteristic impedance ($Z_1$) and the second line section ($W_2$) having a second length ($L_2$) and a second characteristic impedance ($Z_2$) which is not equal to the first characteristic impedance ($Z_1$). The transformer further includes at least one of the conductors having a stepped diameter; and a conducting hollow cylinder for adjusting the lengths of the line sections, the conducting hollow cylinder being displaceable in the direction of the longitudinal axis and being disposed between the inner and outer conductor.

According to an illustrative embodiment, the matching transformer of the invention is preferably constructed as a coaxial line which consists of an outer conductor having a constant inside diameter and of an inner conductor having stepped outside diameters, a conducting hollow cylinder having correspondingly stepped diameters and being displaceable in the direction of the conductor axis being mounted on the inner conductor and being short-circuited to the inner conductor at least with respect to high frequencies.

The matching transformer according to the invention has the advantage that its working frequency can be changed without changing the total length of the wave guide and thus the installed mass. The respective working frequency is simultaneously linked to a certain transfer ratio so that a continuous relationship like a characteristic curve is produced between the frequency and the transfer ratio in the adjustable working range of the transformer. This characteristic curve can be designed by suitable choice of the geometric parameters in such a manner that it matches the characteristic curves of other radio-frequency circuit elements. In this way, for example, a continuously tunable radio-frequency generator can be constructed if the impedance curve of the transmitting tube used corresponds to the characteristic curve of the transformer connected.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
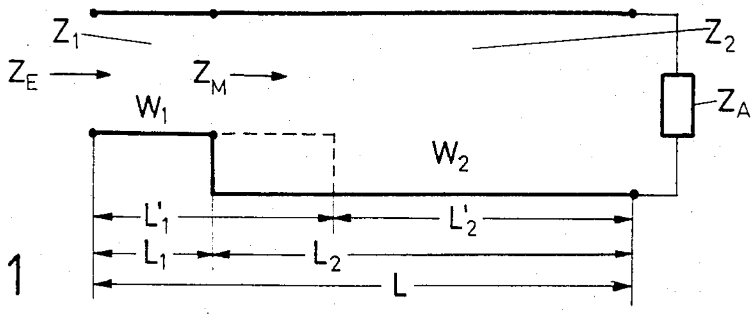
FIG. 1 is an equivalent circuit diagram of a matching transformer according to the invention.

Referring now to the drawings, wherein like reference numerals designate identical or corresponding parts throughout the several views, and more particularly to FIG. 1 thereof, equivalent circuit of the radio-frequency matching transformer according to the invention is shown. A wave guide W of length L is subdivided into at least two line sections $W_1$ and $W_2$ having different characteristic impedances $Z_1$ $Z_2$. The lengths $L_1$ and $L_2$ of the line sections can be adjusted in such a manner that their sum $L_1 + L_2$ remains constant, that is to say the first length decreases by exactly the amount by which the second one increases, and conversely. In operation, the transformer is loaded by a real terminating impedance $Z_A$. This terminating impedance is transformed into a real input impedance $Z_E$. This transformation takes place in several stages, corresponding to the different line sections. The line section $W_2$ initially converts the real terminating impedance $Z_A$ into a generally complex intermediate impedance $Z_M$ which, in turn, is transformed by line section $W_1$ into the real input impedance $Z_E$. Since the transfer can be assumed in a first approximation to be free of attenuation, it obeys the transformation equation known from transmission-line theory.

$$Z_M = \frac{Z_A + j\,Z_2 \tan \beta L_2}{1 + j\,(Z_A/Z_2) \tan \beta L_2},$$

which describes the connection between the terminating impedance $Z_A$ and the intermediate impedance $Z_M$ through line section $W_2$ which has a characteristic impedance of $Z_2$ and length $L_2$.

The size of B is equal to $2\pi/\lambda$ at wavelength $\lambda$ in the line section in question and thus covers the effect of the operating or working frequency on the transformation characteristics. An analogous equation applies to the relationship between $Z_E$, $Z_M$, and $L_1$. If the value $Z_m$ obtained from the above-mentioned equation is inserted into this analogous equation, the demand for a disappearing imaginary component of $Z_E$ results in a conditional equation for the wavelenghts at which the transformation leads from a real value $Z_A$ back to a real value $Z_E$.

A simple special case of this transformation is the familiar two-stage quarter-wave transformer which is distinguished by the fact that the arguments $\beta$,L; of the tangent functions assume the value $\pi/2$ and thus lead to easily determined transfer ratios.

If the lengths $L_1$ and $L_2$ or the line sections change, both the frequency at which the transformation is real and the transfer ratio also change. This results in a set of characteristic curves for the transformer which represents the working frequency and, with constant terminating impedance, the input impedance as a function of the length of one line section. Since the total length L remains constant in every case, a continuously adjustable radio-frequency matching transformer is obtained, the transfer characteristics of which can be changed with the transformer in the built-in condition.

Figure 2:
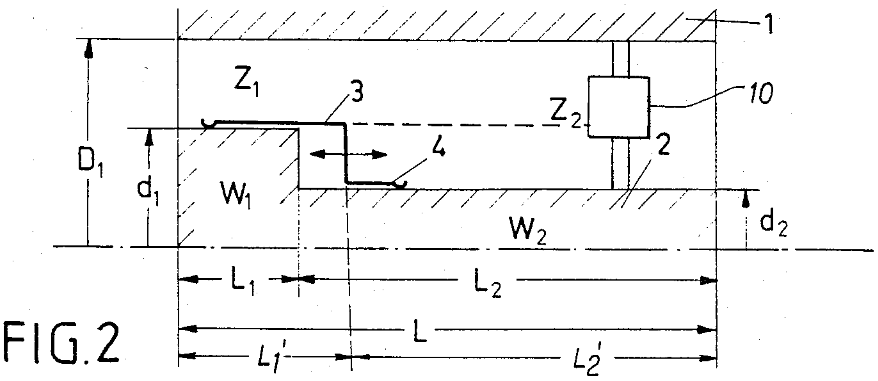
FIG. 2 is a cross-sectional view of a preferred illustrative embodiment of a coaxial matching transformer; according to the invention.

FIG. 2 shows a preferred illustrative embodiment of the matching transformer according to the invention. As a wave guide a coaxial line is provided, which includes an outer conductor 1 having a constant inside diameter $D_1$ and of an inner conductor 2 having stepped outside diameters $d_1$ and $d_2$. In the area of the diameter stage, a conducting hollow cylinder 3 is mounted on the inner conductor 2. The hollow cylinder 3 is displaceable by means of a conventional drive unit 10 in the direction of the axis of the conductors and its diameter is stepped in the same way as that of the inner conductor 2. Its wall thickness is selected to be small enough, with respect to the remaining dimensions of the conductor, that the wave propagation characteristics of the inner conductor 2 are only insignificantly distrubed. The hollow cylinder 3 can be manufactured, for example, from thin sheet metal and covered with a well-conducting layer. It is of particular advantage with regard to the weight if metalized synthetics based on, for example, fiber glass-reinforced epoxy resins are used for the hollow cylinder and also for the other conductors. The hollow cylinder is preferably conductively connected via sliding contacts at its ends to the inner conductor 2 and thus forms a displaceable step on the inner conductor as far as the wave propagation in the coaxial line is concerned. If the hollow cylinder 3 is displaced, for example into the position shown in FIG. 2, transfer ratios are produced in the transformer which no longer correspond to line sections having the lengths $L_1$ and $L_2$, but correspond to line sections having the new lengths $L_1'$ and $L'_2$, both the characteristic impedances $Z_1$ and $Z_2$ and the total length L remaining unchanged.

Incidentally, the characteristic impedances $Z_1$ and $Z_2$ of the line sections are a result of the diameters $D_1$, $d_1$ and $d_2$ in accordance with the formula known for coaxial lines $$Z_1 = \frac{60}{\epsilon_r} \ln \frac{D_1}{d_1}\ (\Omega) \text{ and } Z_2 = \frac{60}{\epsilon_r} \ln \frac{D_1}{d_1}\ (\Omega),$$

the effect of a possible dielectric existing between the outer and inner conductor being accounted for by the relative dielectric constant.

In order to avoid interference affecting the wave propagation in the interspace of the conductor arrangement, it is of advantage to carry out the displacing of the hollow cylinder 3 not via mechanical elements from the outside but via the drive unit 10 mounted in the interior of the inner conductor and consisting, for example, of an electric motor and a preceding gear chain which converts the rotary motion of the motor into a translatory motion acting in the direction of the conductor axis and transmits this motion via the appropriate elements to the hollow cylinder 3.

Figure 3:
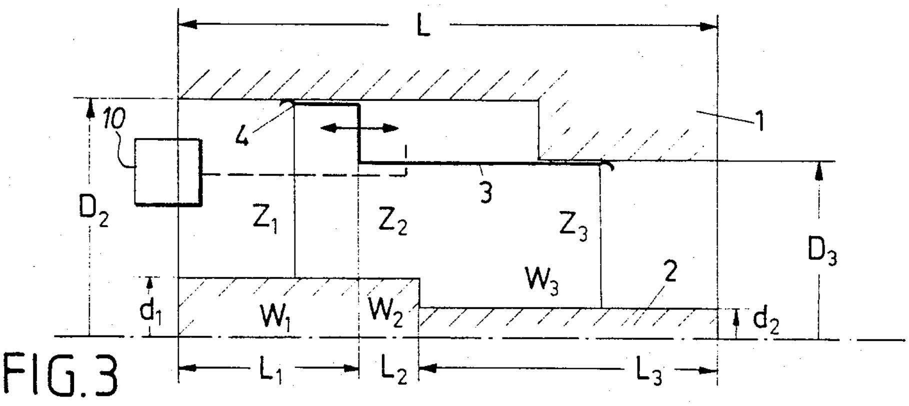
FIGS. 3 and 4 are cross-sectional views of other illustrative embodiments of a coaxial matching transformer according to the invention.

Another illustrative embodiment of the matching transformer according to the invention is shown in FIG. 3. The inner conductor 2 of the coaxial arrangement is again constructed with stepped outside diameters $d_1$ and $d_2$. The outer conductor 1 equally has stepped inside diameters $D_2$ and $D_3$. The diameters of the displaceable hollow cylinder 3 match the outer conductor 1 and the hollow cylinder is short-circuited to the outer conductor at least with respect to high frequencies and thus forms a stepped outer conductor with displaceable edge. The result of this is a coaxial line having at least three different line sections $W_1$, $W_2$ and $W_3$ with corresponding lengths $L_1$, $L_2$ and $L_3$ and characteristic impedances $Z_1$, $Z_2$ and $Z_3$. Since each line section entails an impedance transformation, a further degree of freedom is obtained, with respect to the illustrative embodiment shown in FIG. 2, for implementing the desired transformation characteristics. In addition, the hollow cylinder 3 can be displaced from the outside without disturbing the wave propagation, for example, by means of an operating element, which is rigidly connected to the hollow cylinder 3 and is brought out through a narrow slot in the outer conductor 1 and is actuated by a drive mechanism disposed outside the outer conductor 1.

Figure 4:
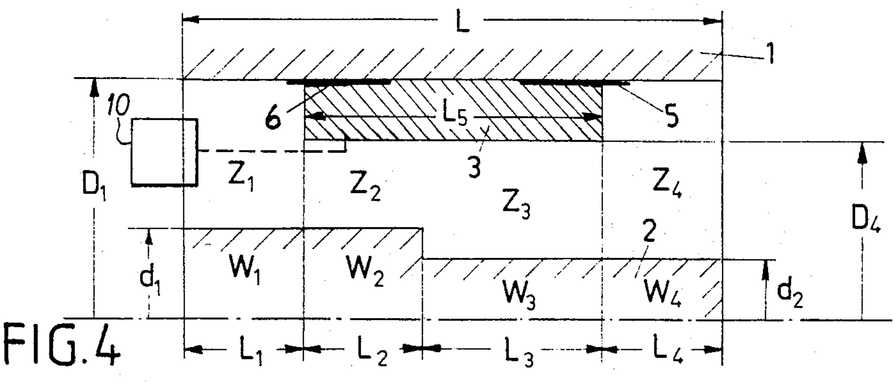

A corresponding operating mechanism can also be provided in the illustrative embodiment shown in FIG. 4, in which embodiment the coaxial line is composed of an inner conductor 2 having stepped outside diameters $d_1$ and $d_2$ and of an outer conductor 1 having a constant inside diameter $D_1$. The larger diameter of the hollow cylinder 3 matches the inside diameter $D_1$ of the outer conductor and the hollow cylinder is provided with a smaller diameter $D_4$, the size of which is between the inside diameter $D_1$ or the outer conductor 1 and the largest outside diameter $d_1$ or the inner conductor. It is short-circuited to the outer conductor at least with respect to high frequencies and, together with it, forms an outer conductor having two edges which can be displaced in the same direction. In this manner, the coaxial line is subdivided into four line seciton $W_1$, $W_2$, $W_3$ and $W_4$ having the lengths $L_1$, $L_2$, $L_3$ and $L_4$ and the characteristic impedances $Z_1$, $Z_2$, $Z_3$ and $Z_4$. The lengths of the line sections are changed interdependently by displacing the hollow cylinder 3, the length $L_5$ of the hollow cylinder 3 and the total length L of the coaxial line remaining constant. The high-frequency short-circuit between the hollow cylinder 3 and the conductor area in contact with it is conveyed in this illustrative embodiment not by sliding contacts, but by a thin dielectric foil layer 5 which is located between the hollow cylinder 3 and the conductor area in contact with it. The foil layer 5 is which, for example, consists of Teflon or Kapton, makes it possible, on the one hand, for the displaceable hollow cylinder to slide almost without friction inside the outer conductor 1. On the other hand, it forms, together with the hollow cylinder and the outer conductor, coaxial line sections 6 having very low impedance. It must be considered here that the electric length of the coaxial line section 6 is smaller than a quarter of the corresponding wavelength $\lambda_G$ at the highest operating frequency.

Figure 5:
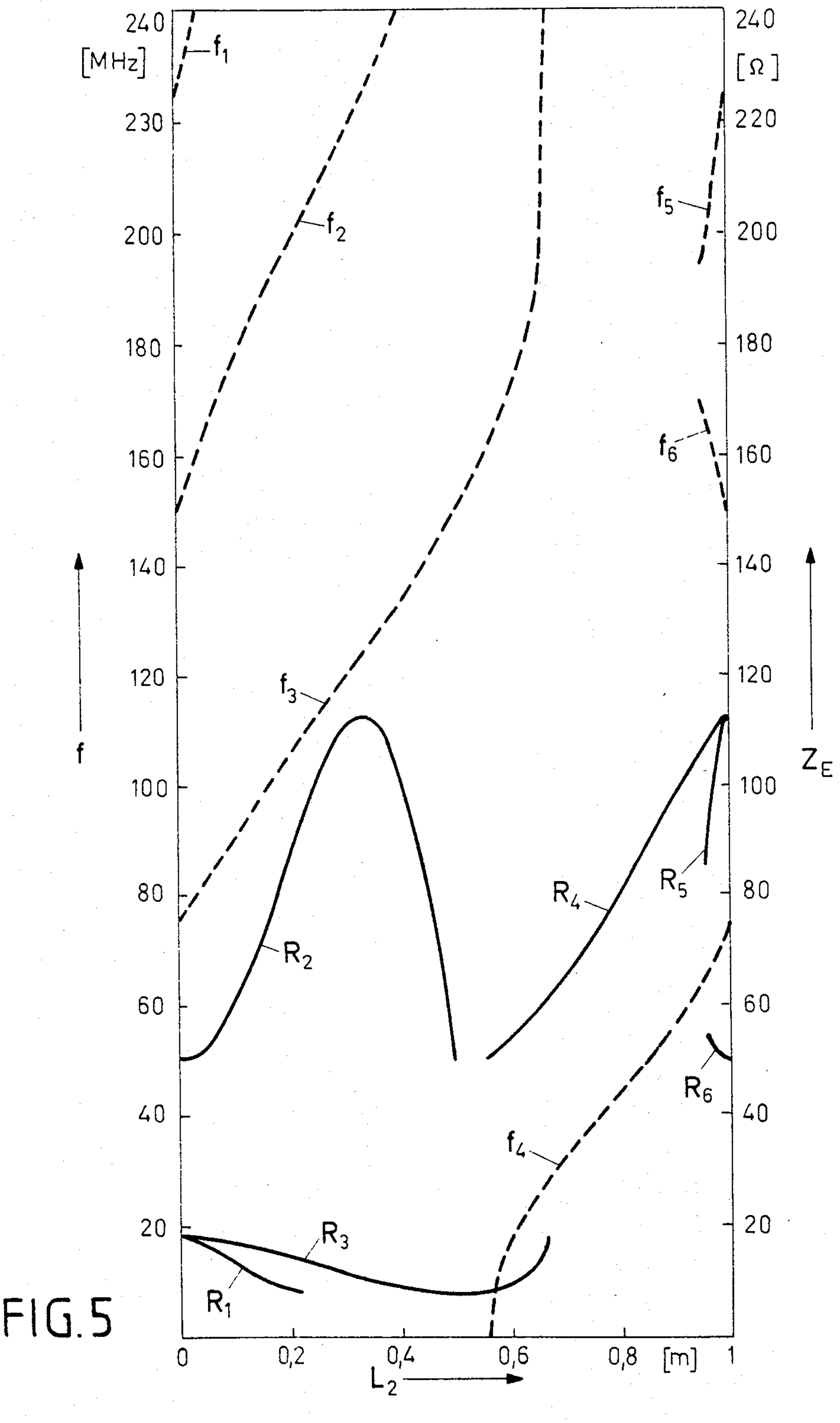
FIG. 5 is a graph illustrating characteristic curves of a coaxial matching transformer in accordance with FIG. 2.

FIG. 5 shows the set of characteristic curves of a matching transformer according to the invention, in accordance with the illustraive embodiment shown in FIG. 2. Using a wave guide having the total length L=1m, the characteristic impedances $Z_1=30\Omega$ and $Z_2=75\Omega$ and the terminating impedance $Z_A=50\ \Omega$ as an example, it shows the curves of the operating frequency f (in MHz) and of the input impedance $Z_E$ (in$\Omega$) resulting from the transformation, as a function of the length $L_2$ (in m). It can be seen that over the whole range of variations of length $L_2$, not one uniform well-defined characteristic of the solution exists, but rather a multiplicity of characteristics of the frequency ($f_1 \ldots f_6$) and of the input impedance ($R_1 \ldots R_6$) for certain ranges of length. Thus, for example, the associated pair of characteristics $f_2$ and $R_2$ shows that with a length $L_2$ of between 0 and 0.4 m the operating frequency varies monotonously between 150 and 240 MHz according to curve $f_2$ whereas, in accordance with curve $R_2$, the input impedance $Z_E$, that is to say the terminating impedance Z transformed by the matching transformer varies between 50 and 113 Ω has a prominent maximum at $L_2=0.33$ m.

The pair of characteristics $R_3$, $f_3$ is of particular significance for the application. It shows that the matching transformer according to the invention can be continuously tuned over a large frequency range of more than 150 MHz by changing the length $L_2$ with only a slight change in the transformation ratio.

Figure 6:
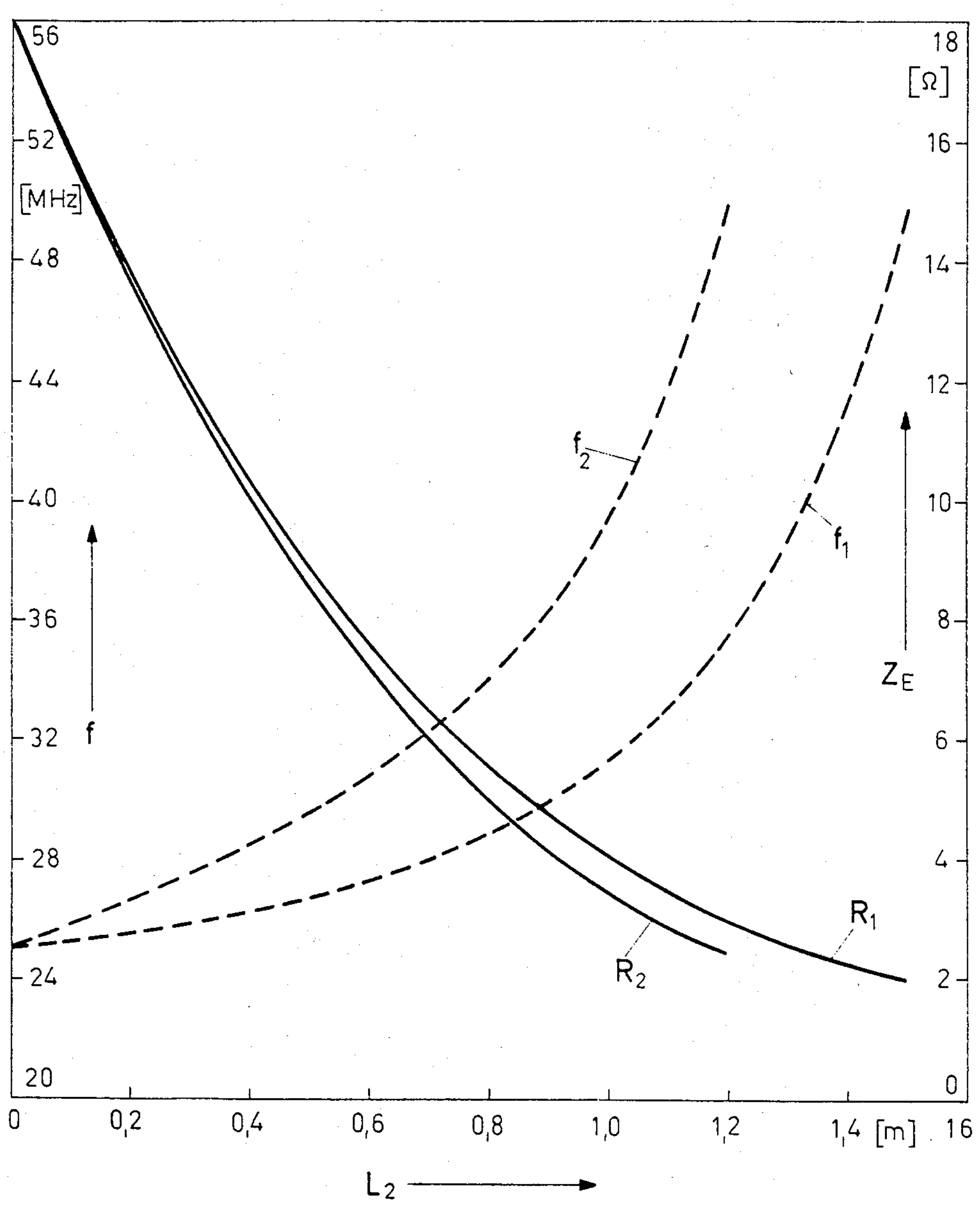
FIG. 6 is a graph illustrating characteristic curves of a coaxial matching transformer according to FIG. 4.

Corresponding sets of characteristic curves also described the operational behavior of the illustrative embodiments of FIGS. 3 and 4. Thus the characteristic curves shown in FIG. 6 applies to an arrangement as shown in FIG. 4. In this illustration, the pair of curves $R_1$, $f_1$ belongs to an embodiment having the dimensions $L_1+L_2=L_3+L_4=L_5=1.5$ m and the impedances $Z_1=Z_3=30\ \Omega$, $Z_2=10\ \Omega$and $Z_4=Z_A=50\ \Omega$. With unchanged impedances, the corresponding dimensions $L_1+L_2=1.25$ m and $L_3+L_4=L_5=1.75$ m apply to the pair of curves $R_2$, $f_2$.

Overall, in accordance with the invention, matching transformers can be constructed by means of a suitable choice of the geometric and electric parameters and by combining several movable and fixed diameter stages at outer and/or inner conductors, the characteristics of which matching transformers optimally meet respective purpose of application in a radio-frequency circuit and the characteristic values of operating frequency and transfer ratio of which can be continuously changed within wide ranges without the transformer itself having to be removed and installed.

In addition, the matching transformer according to the invention can also be used, with the appropriate modifications, in hollow wave guide and microstrip systems.

Obviously, numerous modifications and variations of the present invention are possible in light of the above teachings. It is therefore to be understood that within the scope of the appended claims, the invention may be practiced otherwise than as sepcifically described herein.

What is claimed as new and desired to be secured by Letters Patent of the United States is:

1. A radio-frequency matching transformer comprising:

a coaxial line including outer and inner conductors, said coaxial line having a fixed length and being subdivided into first and second line sections, said first line section having a first length and a first characteristic impedance and said second line section having a second length and a second characteristic impedance different from said first characteristic impedance; and means for simultaneously adjusting said first and second lengths, wherein the sum of said first and second lengths remains constant and equals said fixed length;

said outer conductor having an inside diameter constant over said fixed length;

said inner conductor being subdivided into first and second parts, said first part having a first outside diameter and a third length, and said second part having a second outside diameter different from said first outside diameter and a fourth length, wherein said third and fourth lengths are fixed and wherein the sum of said third and fourth length equals said fixed length of said coaxial line; and said adjusting means comprising a conducting hollow cylinder disposed between said inner and outer conductor and displaceable along the length of said coaxial line, said hollow cylinder having at least one stepped portion having diameters respectively stepped in correspondence with said first and second outside diameters, and being mounted on said inner conductor such that at least with respect to high frequencies said stepped portion is short-circuited to said first and second parts, respectively, of said inner conductor, said first length of said first line section corresponding to the sum of said third length of said first part and a length of a part of said hollow cylinder extending from an end of said first part to the step of said stepped portion of said conducting hollow cylinder.

2. A radio-frequency matching transformer comprising:

a coaxial line including outer and inner conductors, said coaxial line having a fixed length and being subdivided into first, second and third line sections having respective first, second and third lengths and respective first, second and third characteristic impedances, said characteristic impedances differing from one another; and means for simultaneously adjusting two of said three line section lengths, wherein the sum of said adjustable two lengths remains constant and equals the difference between said fixed length of said coaxial line and the remaining line section length;

said outer conductor being subdivided into first and second parts, said first part having a first inside diameter and a forth length, and said second part having a second inside diameter different from said first inside diameter and a fifth length;

said inner conductor being subdivided into a first part and a second part, said inner conductor first part having a first outside diameter and a sixth length, and said inner conductor second part having a second outside diameter different from said first outside diameter and a seventh length;

wherein said fourth, fifth, sixth and seventh lengths are fixed and the sum of the fourth and fifth lenghths equals said fix length and the sum of the sixth and seventh lengths equals said fixed length, respectively, of said coaxial lines; and said adjusting means comprising a conductive hollow cylinder disposed between said inner and outer conductors and displaceable along the length of said coaxial line, said hollow cylinder having at least one stepped portion having diameters respectively stepped in correspondence with said outer conductor first and second inside diameters and being mounted within said outer conductor such that said stepped portion is respectively short-circuited to said first and second parts at least with respect to high frequencies;

said first line section of said coaxial line extending from a first end of said coaxial line to an adjustable point corresponding to the location of the step of said hollow conducting cylinder when said step is located within said sixth length of said first part of said inner conductor or for the entire length of said sixth length when said step is located beyond said first part of said inner conductor in a direction away from said first end, said second line section extending from said step to the end of said first part of said inner conductor, and said third line section extending from a second end of said coaxial line opposite said first end to said step when said step is closer to said second end than said end of said first part of said inner conductor and from said second end to said end of said first part of said inner conductor when said end of said first part of said inner conductor is closer to said second end than said step.

3. A radio-frequency matching transformer comprising:

a coaxial line including outer and inner conductors, said coaxial line having a fixed length and being subdivided into four line sections with respective line section lengths and characteristic impedances, wherein at least three of said characteristic impedances differ from each other; and means for simulaneously adjusting said four line section lengths;

wherein the sum of said four line section lengths remain constant and equals said fixed length.

4. A radio-frequency matching transformer as claimed in claim 3, comprising:

said outer conductor having an inside diameter constant over said fixed length:

said inner conductor being subdivided into first and second parts, said first part having a first outside diameter and a first length, and said second part having a second outside diameter different from said first outside diameter and a second length, wherein said first and second lengths are fixed and their sum equals the fixed length of said coaxial line; and said adjusting means comprising a conducting hollow cylinder disposed between said inner and outer conductors and displaceable along the axis of said coaxial line, said hollow cylinder having first and second opposed ends defining a constant length therebetween smaller than said fixed length with an outside diameter essentially equal to said inside diameter of said outer conductor and an inside diameter larger than said first and second outside diameters of said inner conductor, and said hollow cylinder being shortcircuited to said outer conductor at least with respect to high frequencies;

said four line sections comprising, a first line section extending from a first end of said coaxial line to said first end of said conducting hollow cylinder, a second line section extending from said first end of said cylinder to an end of said first length of said first part of said inner conductor, a third line section extending from said end of said first length of said first part of said inner conductor to said second end of said cylinder, and a fourth line section extending from said second end of said cylinder to a second end of said coaxial line.

* * * * *